(12) United States Patent
Kume

(10) Patent No.: US 12,507,346 B2
(45) Date of Patent: Dec. 23, 2025

(54) ELECTRONIC COMPONENT PACKAGE AND METHOD FOR MANUFACTURING ELECTRONIC COMPONENT PACKAGE

(71) Applicant: Murata Manufacturing Co., Ltd., Kyoto-fu (JP)

(72) Inventor: Norikazu Kume, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 199 days.

(21) Appl. No.: 18/453,172

(22) Filed: Aug. 21, 2023

(65) Prior Publication Data
US 2024/0090133 A1 Mar. 14, 2024

(30) Foreign Application Priority Data
Sep. 8, 2022 (JP) .................. 2022-143022

(51) Int. Cl.
*H05K 1/18* (2006.01)
*H05K 1/03* (2006.01)
*H05K 3/18* (2006.01)

(52) U.S. Cl.
CPC ........... *H05K 1/181* (2013.01); *H05K 1/0306* (2013.01); *H05K 3/188* (2013.01); *H05K 2201/10371* (2013.01); *H05K 2203/107* (2013.01)

(58) Field of Classification Search
CPC .......................................... H05K 2201/10371
See application file for complete search history.

(56) References Cited

U.S. PATENT DOCUMENTS

2007/0232107 A1* 10/2007 Sugiura ............... B81C 1/00269
439/226

FOREIGN PATENT DOCUMENTS

| JP | 2002-246493 A | 8/2002 |
|---|---|---|
| JP | 2011-172086 A | 9/2011 |
| JP | 2012-125596 A | 7/2012 |
| JP | 2013211441 A | * 10/2013 |
| JP | 2013239555 A | * 11/2013 |
| JP | 2017-534178 A | 11/2017 |
| JP | 2021-132250 A | 9/2021 |

OTHER PUBLICATIONS

JP 2013211441 A Translation (Year: 2025).*
JP 2013239555 A Translation (Year: 2025).*

* cited by examiner

*Primary Examiner* — Timothy J Thompson
*Assistant Examiner* — John B Freal
(74) *Attorney, Agent, or Firm* — Studebaker Brackett PLLC

(57) ABSTRACT

An electronic component package includes a base, a lid, and a bonding layer part. The lid has a first recess. The lid is bonded to the base with a bonding layer part interposed therebetween. The base closes the first recess of the lid. The base and the lid define an internal space of the electronic component package. An electronic component is located in the internal space of the electronic component package. The electronic component is mounted on the base.

11 Claims, 5 Drawing Sheets

ELECTRONIC COMPONENT PACKAGE AND METHOD FOR MANUFACTURING ELECTRONIC COMPONENT PACKAGE

CROSS-REFERENCE TO RELATED APPLICATION

This application claims benefit of priority to Japanese Patent Application No. 2022-143022, filed Sep. 8, 2022, the entire content of which is incorporated herein by reference.

BACKGROUND

Technical Field

The present disclosure relates to electronic component packages and methods for manufacturing electronic component packages.

Background Art

An electronic component package described in Japanese Unexamined Patent Application Publication No. 2002-246493 includes a ceramic base and a substantially plate-shaped lid. The base has a structure composed of a plurality of sheets stacked together. In addition, some of the sheets have a hole. The sheets are stacked together such that the positions of the holes coincide with each other. Thus, the base has a recess. In addition, a metallized plating layer is formed around the opening edge of the recess of the base. The lid is bonded to the metallized plating layer of the base by laser irradiation.

For an electronic component package as described in Japanese Unexamined Patent Application Publication No. 2002-246493, the thickness of an electronic component that can be housed in the electronic component package is limited to a thickness smaller than or equal to the depth of the recess of the base. On the other hand, if the depth of the recess is to be increased, the number of sheets stacked for the base needs to be increased. This increases the number of steps for manufacturing the base. In addition, even if the base is not a base composed of a plurality of sheets stacked together, it is not preferred to form a deep recess in the base used for the electronic component package because, for example, the number of steps for manufacturing the base and the complexity of the manufacturing process increase.

SUMMARY

Accordingly, the present disclosure provides an electronic component package including a ceramic base; a metallized layer that is a metal film formed on a particular surface that is a particular flat outer surface of the base; a metal lid; a plating layer located between the metallized layer and the lid; and an electronic component mounted on the base. The lid includes a lid body having a recess and a flange having a frame shape extending along an opening edge of the recess. The flange extends outward of the recess in a direction parallel to the particular surface and is bonded to the metallized layer with the plating layer interposed therebetween. The metallized layer has a frame shape facing the flange. The base closes an opening of the recess. The electronic component is located in a space defined by the base and the lid.

The present disclosure further provides a method for manufacturing an electronic component package. The method includes a lid providing step of providing a lid including a lid body having a recess and a flange extending outward of the recess in a direction parallel to an imaginary plane surrounded by an opening edge of the recess; a metallizing step of forming a metallized layer having a frame shape corresponding to the flange on a particular surface that is a particular flat outer surface of a ceramic base on which an electronic component is mounted; a plating step of forming a plating layer on an opposite side from the base with respect to the metallized layer; and a bonding step of placing the flange on the plating layer such that the electronic component is located in the recess and irradiating the flange with laser light to bond the flange to the metallized layer with the plating layer interposed therebetween.

In the above configuration, the metal lid has a recess. Thus, the internal volume of the electronic component package can be increased simply by forming a lid having a larger first recess. Increasing the internal volume of the electronic component package in this way does not increase the number of steps for manufacturing the base or the complexity of the manufacturing process.

The internal volume of the electronic component package can be increased without increasing the number of steps for manufacturing the base or the complexity of the manufacturing process.

DETAILED DESCRIPTION

Figure 1:
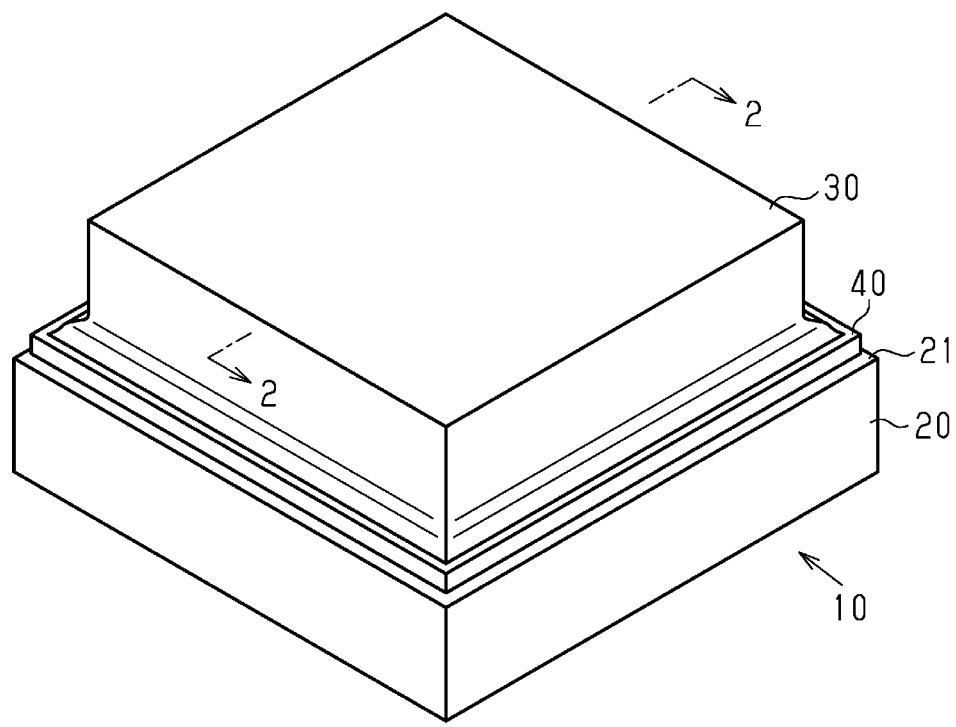
FIG. 1 is a perspective view of an electronic component package.

Electronic Component Package According to One Embodiment

An electronic component package according to one embodiment will be described below with reference to the drawings. It should be noted that the components illustrated in the drawings may be magnified to facilitate understanding. The dimensional ratios of the components may differ from those of actual components or from those in different figures.

Overall Structure

Figure 2:
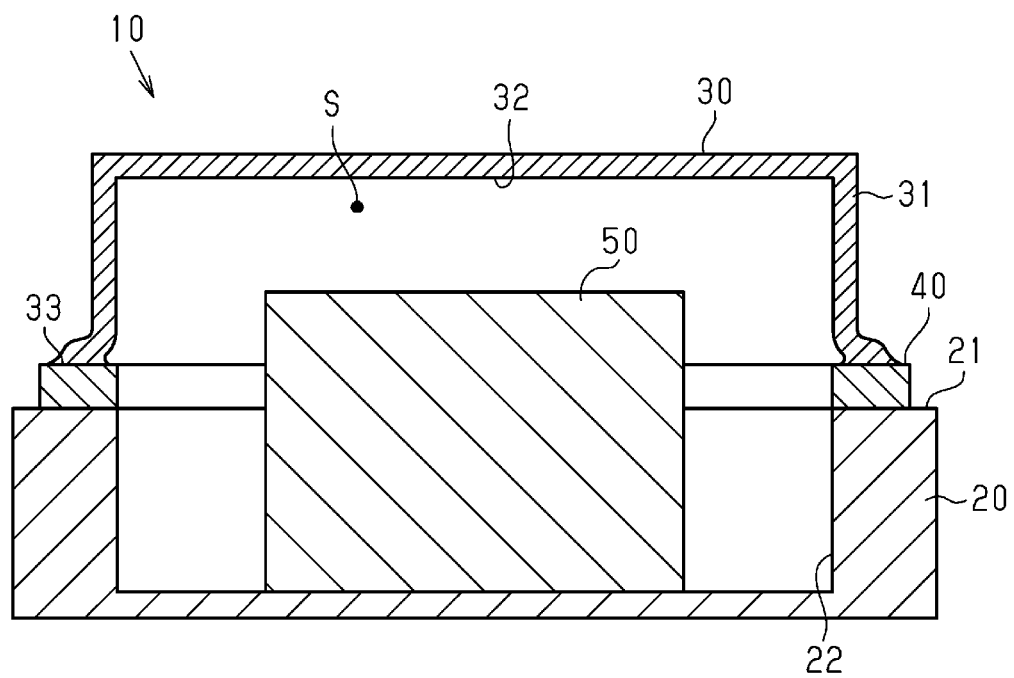
FIG. 2 is a sectional view taken along line 2-2 in FIG. 1.

As illustrated in FIG. 1, the external appearance of an electronic component package 10 has a substantially rectangular parallelepiped shape as a whole. The electronic component package 10 includes a base 20, a lid 30, and a bonding layer part 40. The lid 30 is bonded to the base 20 with the bonding layer part 40 interposed therebetween. As illustrated in FIG. 2, the lid 30 has a first recess 32. Similarly, the base 20 has a second recess 22. The second recess 22 of the base 20 faces the first recess 32 of the lid 30. Thus, the base 20 closes the first recess 32 of the lid 30. In addition, the base 20 and the lid 30 define an internal space S of the electronic component package 10. The internal space S is filled with, for example, an inert gas.

As illustrated in FIG. 2, the electronic component package 10 includes an electronic component 50. The electronic component 50 is located in the internal space S of the electronic component package 10. In addition, the electronic component 50 is mounted on the base 20. In the present embodiment, the electronic component 50 is mounted on the bottom surface of the second recess 22. The term "mounted" as used herein is a concept including not only a situation where electrodes of the electronic component 50 are connected to, for example, wiring lines of the base 20, but also a situation where the electronic component 50 is simply fixed to the base 20. The electronic component 50 is, for example, a quartz vibrator.

Base

As illustrated in FIGS. 1 and 2, the base 20 has a substantially square box shape with a second recess 22 having a substantially rectangular parallelepiped shape. A particular surface 21 is a particular outer surface of the base 20. The particular surface 21 of the base 20 is a surface having the opening of the second recess 22. The particular surface 21 has a square frame shape surrounding the second recess 22. In the following description, the opening edge of the second recess 22 is an inner edge of the square frame-shaped particular surface 21.

The base 20 is formed of a ceramic. Specifically, the material for the base 20 is an alumina ceramic made of aluminum oxide. Although not illustrated, the base 20 has a structure composed of a plurality of ceramic sheets stacked together. Some of the sheets forming the base 20 have a hole formed therein. The sheets are stacked together such that the holes in the sheets coincide with each other. Thus, the base 20 has the second recess 22 formed therein. The sheets forming the base 20 have been combined together after stacking and firing; therefore, the boundaries between the sheets may be indiscernible.

Bonding Layer Part

Figure 3:
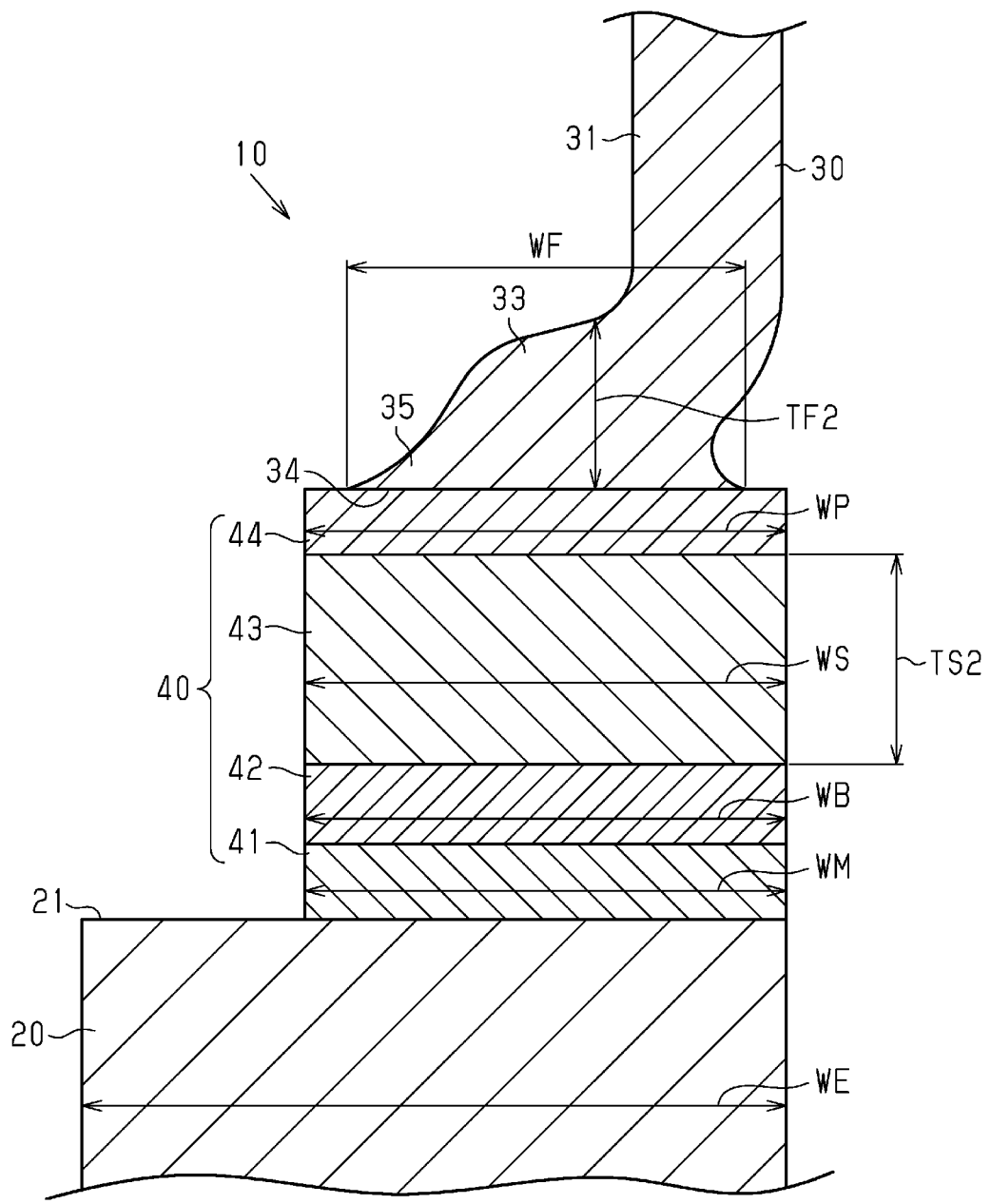
FIG. 3 is an enlarged view of the electronic component package in FIG. 2.

As illustrated in FIG. 3, the bonding layer part 40 includes a metallized layer 41, a brazing material layer 42, a seal ring 43, and a plating layer 44. In addition, the above layers are stacked in the following order from the particular surface 21 side of the base 20: the metallized layer 41, the brazing material layer 42, the seal ring 43, and the plating layer 44. Thus, the brazing material layer 42 is located between the metallized layer 41 and the plating layer 44. In addition, the seal ring 43 is located between the brazing material layer 42 and the plating layer 44. Furthermore, the plating layer 44 is located between the metallized layer 41 and the lid 30.

The metallized layer 41 is a metal film formed on the particular surface 21 of the base 20. The metallized layer 41 has a square frame shape reflecting the shape of the particular surface 21 in plan view. The material for the metallized layer 41 is a metal with high connectivity to ceramics. For example, the material for the metallized layer 41 contains a metal such as tungsten, molybdenum, or manganese. The material for the metallized layer 41 also contains glass.

The brazing material layer 42 is disposed on the surface of the metallized layer 41. The brazing material layer 42 covers substantially the entire surface of the metallized layer 41. That is, the brazing material layer 42 has a square frame shape. The brazing material layer 42 is a metal layer for brazing together the metallized layer 41 and the seal ring 43. The material for the brazing material layer 42 contains one or more metals selected from gold, silver, and copper.

Here, as illustrated in FIG. 3, the electronic component package 10 is viewed in a cross-section perpendicular to the particular surface 21. In this cross-section, the width WB of the brazing material layer 42 is the dimension of the brazing material layer 42 in a direction along the particular surface 21. In the same cross-section, the width WM of the metallized layer 41 is the dimension of the metallized layer 41 in the direction along the particular surface 21. In the same cross-section, the width WB of the brazing material layer 42 is substantially equal in dimension to the width WM of the metallized layer 41.

As illustrated in FIG. 3, the seal ring 43 is disposed on the surface of the brazing material layer 42. The seal ring 43 covers substantially the entire surface of the brazing material layer 42. That is, as with the metallized layer 41 and the brazing material layer 42, the seal ring 43 has a square frame shape. The material for the seal ring 43 is, for example, Kovar.

Here, as illustrated in FIG. 3, the electronic component package 10 is viewed in a cross-section perpendicular to the particular surface 21. In this cross-section, the seal ring width WS is the width of the seal ring 43 in a direction along the particular surface 21. In the same cross-section, the edge-to-edge width WE of the base 20 is the dimension from the opening edge of the second recess 22 in the particular surface 21 to the outer edge of the particular surface 21. In the same cross-section, the seal ring width WS is smaller in dimension than the edge-to-edge width WE of the base 20. In addition, the size of the opening of the seal ring 43 is larger than or equal to the size of the opening of the second recess 22 of the base 20. In this embodiment, when the electronic component package 10 is viewed in a direction orthogonal to the particular surface 21, the opening edge of the seal ring 43 substantially coincides with the opening edge of the second recess 22. In the same cross-section, the seal ring width WS is substantially equal in dimension to the width WB of the brazing material layer 42 and the width WM of the metallized layer 41.

The plating layer 44 is disposed on the surface of the seal ring 43. The plating layer 44 covers substantially the entire surface of the seal ring 43. That is, as with the metallized layer 41, the brazing material layer 42, and the seal ring 43, the plating layer 44 has a square frame shape. The material for the plating layer 44 contains one or more metals selected from gold, silver, and copper. The plating layer 44 is a metal layer for bonding together the seal ring 43 and the lid 30. Here, as illustrated in FIG. 3, the electronic component package 10 is viewed in a cross-section perpendicular to the particular surface 21. In this cross-section, the width WP of the plating layer 44 is the dimension of the plating layer 44 in a direction along the particular surface 21. The width WP of the plating layer 44 is substantially equal in dimension to the seal ring width WS.

A wavelength range of from 0.9 µm to 1.1 µm is referred to as "particular wavelength range". The plating layer 44 has a lower absorbance in the particular wavelength range than the seal ring 43. This difference in absorbance is due to the difference between the material for the plating layer 44 and the material for the seal ring 43.

Lid

As illustrated in FIGS. 1 and 2, the lid 30 has a substantially square box shape with a first recess 32 having a substantially rectangular parallelepiped shape. The lid 30 is formed of a metal. Specifically, the material for the lid 30 is identical to the material for the seal ring 43. That is, the material for the lid 30 is, for example, Kovar. The lid 30 includes a lid body 31 and a flange 33. The lid body 31 has the first recess 32 described above. That is, the lid body 31 has a substantially square box shape. The flange 33 extends outward from the opening edge of the first recess 32 of the lid body 31 in a direction parallel to the particular surface 21. The flange 33 extends along the entire opening edge of the first recess 32. Thus, the flange 33 has a square frame shape.

The lid 30 is a one-piece member including the lid body 31 and the flange 33. Thus, the lid 30 also has a recess. The opening edge of the lid 30 is an edge, on the internal space S side, of a surface 34 of the flange 33 bonded to the plating layer 44.

Here, as illustrated in FIG. 3, the electronic component package 10 is viewed in a cross-section perpendicular to the particular surface 21 of the base 20. In this cross-section, the flange width WF is the width from the opening edge of the first recess 32 of the lid 30 to the leading end of the flange 33 in a direction along the particular surface 21. In the same cross-section, the flange width WF is smaller in dimension than the edge-to-edge width WE of the particular surface 21. In addition, the flange width WF is smaller in dimension than the seal ring width WS.

In the above cross-section, the maximum dimension TF2 of the flange 33 in a direction perpendicular to the particular surface 21 is smaller than the maximum dimension TS2 of the seal ring 43 in the direction perpendicular to the particular surface 21.

The flange 33 includes a bonded portion 35 including the surface 34 bonded to the plating layer 44. The bonded portion 35 has a so-called fillet shape. That is, as viewed in a cross-section perpendicular to the particular surface 21, the dimension of the bonded portion 35 in a direction along the particular surface 21 becomes larger toward the plating layer 44. In addition, the bonded portion 35 has a fillet shape not only on the leading end side of the flange 33, but also near the opening edge of the first recess 32.

The plating layer 44 has a lower absorbance in the particular wavelength range than the flange 33. In addition, the flange 33 has substantially the same absorbance as the seal ring 43. These differences in absorbance are due to the differences between the material for the flange 33, the material for the plating layer 44, and the material for the seal ring 43.

Method for Manufacturing Electronic Component Package

Next, a method for manufacturing the electronic component package 10 according to the present embodiment will be described with reference to the drawings. It should be noted that the base 20 having the shape described above has been formed in advance.

Figure 4:
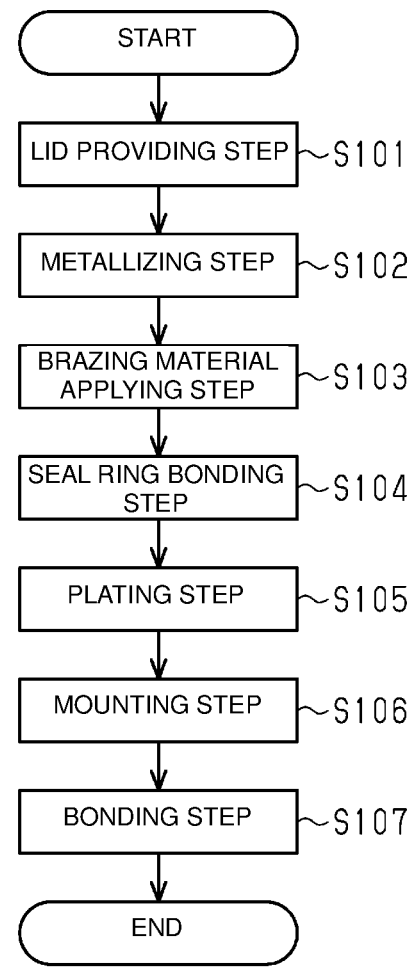
FIG. 4 is a flowchart of a manufacturing process.

As illustrated in FIG. 4, the method for manufacturing the electronic component package 10 includes a lid providing step S101, a metallizing step S102, a brazing material applying step S103, a seal ring bonding step S104, a plating step S105, a mounting step S106, and a bonding step S107.

As illustrated in FIG. 4, the lid 30 that has been formed is first provided in the lid providing step S101. The lid 30 is formed as follows. A metal plate formed of a material such as Kovar is first provided. The metal plate is then formed into a substantially square box shape by a process such as press forming to form the lid body 31. During this process, the flange 33 is formed at the same time as the lid body 31. That is, a bend is formed outward from the opening edge of the first recess 32 by a process such as press forming. Here, the lid 30 is formed such that the angle between the bottom surface of the first recess 32 of the lid body 31 and the side surfaces of the lid body 31 is from 45° to 90°.

Next, as illustrated in FIG. 4, the metallizing step S102 is performed. In the metallizing step S102, a metallizing paste is first applied in a square frame shape corresponding to the flange 33 to the particular surface 21 of the base 20. The metallizing paste is formed of, for example, tungsten, molybdenum, or manganese. The metallizing paste is then fired. Thus, the metallized layer 41 is formed on the particular surface 21 of the base 20.

Next, as illustrated in FIG. 4, the brazing material applying step S103 is performed. In the brazing material applying step S103, a brazing material is first applied in a square frame shape substantially over the entire surface of the metallized layer 41. The brazing material is one or more metals selected from gold, silver, and copper. Thus, the brazing material layer 42 is formed on the surface of the metallized layer 41.

Next, as illustrated in FIG. 4, the seal ring bonding step S104 is performed. In the seal ring bonding step S104, the seal ring 43 is first placed on the surface of the brazing material. The seal ring 43 has a square frame shape and is formed of a metal such as Kovar. The seal ring 43 and the brazing material are then heated. Thus, the seal ring 43 is bonded to the metallized layer 41 with the brazing material layer 42 interposed therebetween.

Next, as illustrated in FIG. 4, the plating step S105 is performed. In the plating step S105, the plating layer 44 is formed on the opposite side from the base 20 with respect to the metallized layer 41 by a process such as electroplating. Specifically, the surface of the seal ring 43 bonded to the base 20 is immersed in a plating solution, and a predetermined current is allowed to flow therethrough. Thus, the plating layer 44 is formed on the surface of the seal ring 43. The component of the plating solution is selected such that the plating layer 44 has a lower absorbance than the flange 33. Specifically, the plating solution is a solution containing one or more metals selected from gold, silver, and copper.

Next, as illustrated in FIG. 4, the mounting step S106 is performed. In this mounting step S106, the electronic component 50 is mounted on the bottom surface of the second recess 22 of the base 20 by any method.

Figure 5:
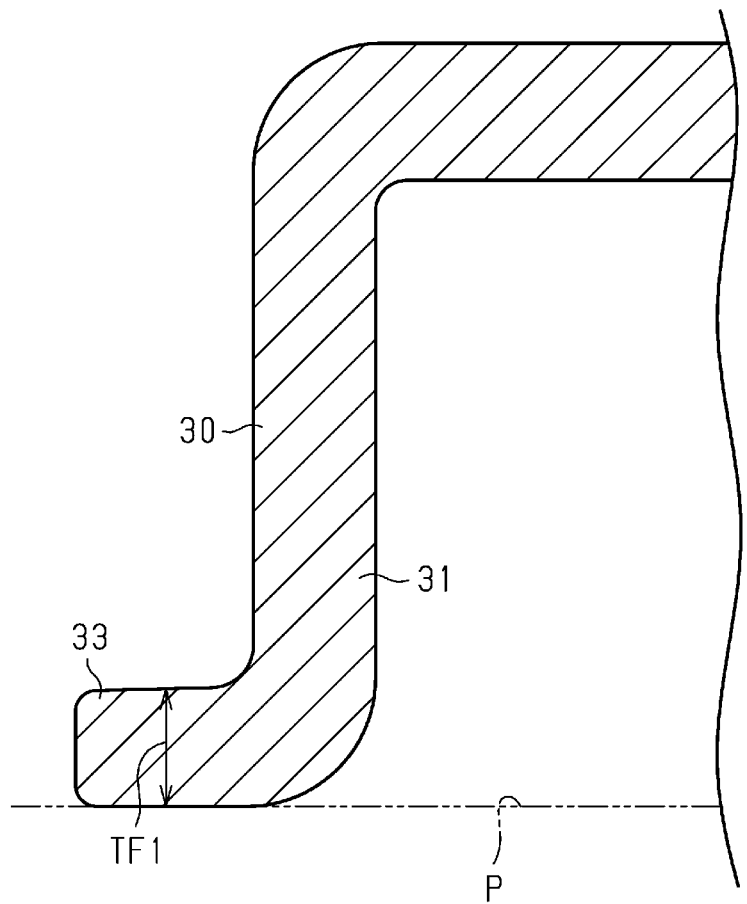
FIG. 5 is a sectional view of a lid after a lid providing step.
Figure 6:
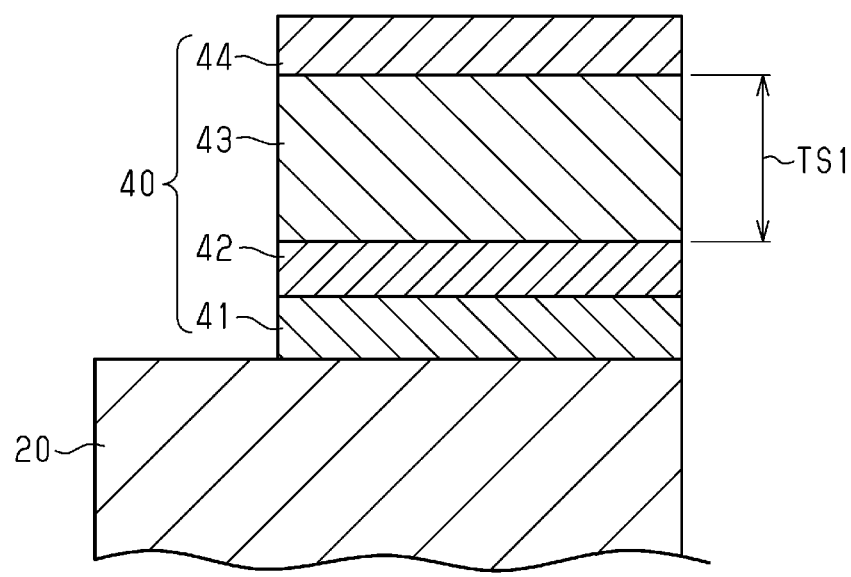
FIG. 6 is a sectional view of a base and a bonding layer part after a plating step.

Next, as illustrated in FIG. 4, the bonding step S107 is performed. Here, before the bonding step S107, an imaginary plane P that is a plane surrounded by the opening edge of the first recess 32 is assumed for the lid 30 formed in the lid providing step S101. As illustrated in FIG. 5, the lid 30 is viewed in a cross-section perpendicular to the imaginary plane P. The flange thickness TF1 is the dimension of the flange 33 in a direction perpendicular to the imaginary plane P. In addition, as illustrated in FIG. 6, the seal ring thickness TS1 is the dimension of the seal ring 43 in a direction perpendicular to the particular surface 21 of the base 20 before the bonding step S107 and after the seal ring bonding step S104 as viewed in a cross-section perpendicular to the particular surface 21. The flange thickness TF1 is smaller than or equal to the seal ring thickness TS1.

In the bonding step S107, the flange 33 is placed on the plating layer 44 such that the electronic component 50 is located in the first recess 32 in an inert atmosphere within the internal space S. The entire flange 33 is in contact with the plating layer 44. Substantially the entire flange 33 is irradiated with pulsed laser light in the particular wavelength range. Thus, the flange 33 is melted and bonded to the surface of the plating layer 44.

Advantages of Embodiment (1) According to the above embodiment, the metal lid 30 has the first recess 32. Thus, the internal volume of the electronic component package 10 can be increased simply by forming a lid 30 having a larger first recess 32. Increasing the internal volume of the electronic component package 10 in this way does not increase the number of steps for manufacturing the base 20 or the complexity of the manufacturing process. In addition, the size of the electronic component package 10 can be reduced simply by forming a lid 30 having a first recess 32 with a smaller volume. That is, the size of the electronic component package 10 can be easily reduced while high gastightness is maintained. Thus, a small electronic component 50 can be housed in a small base 20 and lid 30 without increasing the size of the electronic component package 10 more than necessary. It should be noted that this advantage can be achieved even if the base 20 is not a base composed of a stack of sheets.

(2) According to the above embodiment, the base 20 and the lid 30 can be firmly bonded together using the seal ring 43 and the brazing material layer 42. The plating layer 44 has a lower absorbance than the flange 33 and the seal ring 43. Thus, when the flange 33 is bonded by irradiation with laser light in the particular wavelength range, the plating layer 44 dissipates heat while reducing laser absorption, so that the likelihood of the seal ring 43, the brazing material layer 42, the metallized layer 41, and the base 20 becoming hot and melting excessively can be reduced.

(3) According to the above embodiment, the flange 33 of the lid 30 has a relatively small maximum dimension TF2. Thus, the lid 30 can be sufficiently bonded even if the laser intensity for irradiation is reduced or the laser irradiation time is shortened.

(4) According to the above embodiment, the flange width WF of the flange 33 is smaller than the edge-to-edge width WE of the base 20. Thus, the flange 33 melted in the bonding step S107 can be prevented from spreading beyond the base 20.

(5) According to the above embodiment, the plating layer 44 is formed of one or more metals selected from gold, silver, and copper. Gold, silver, and copper are suitable as the material for the plating layer 44 since they exhibit relatively low light absorption in a wavelength range of from 0.9 μm to 1.1 μm. Furthermore, gold, silver, copper have high thermal conductivity. Therefore, when the flange 33 is bonded to the metallized layer 41 with the plating layer interposed therebetween, with laser light in the above wavelength range, heat is easily dissipated from the plating layer 44. Thus, the electronic component package 10 is less likely to become hot.

(6) According to the above embodiment, the plating layer 44 has a lower absorbance in the particular wavelength range than the flange 33. Therefore, when the flange 33 is bonded to the metallized layer 41 with the plating layer interposed therebetween, by irradiation with laser light in the particular wavelength range, the flange 33 melts easily, whereas the plating layer 44 does not melt easily. Thus, the plating layer 44 easily dissipates heat from the melted flange 33 while reducing laser absorption. This makes it easier to prevent the seal ring 43, the brazing material layer 42, the metallized layer 41, and the base 20 from becoming hot and melting excessively.

(7) According to the above embodiment, the bonded portion 35, which is the portion of the lid 30 bonded to the plating layer 44, has a so-called fillet shape inside and outside the internal space S. This fillet shape allows the lid 30 to be bonded to the plating layer 44 over a larger area. Thus, a higher bonding strength and a higher gastightness can be achieved even if a lid 30 having a smaller flange 33 is formed.

(8) According to the above embodiment, the flange width WF is smaller in dimension than the edge-to-edge width WE. Thus, the first recess 32 of the lid 30 can be sealed with the base 20 in the bonding step S107 even if the lid 30 is misaligned with respect to the base 20 to some extent.

(9) According to the above embodiment, the base 20 and the lid 30 are bonded together by laser irradiation. Therefore, the base 20 and the lid 30 can be relatively accurately bonded together even if a lid 30 having a small flange width WF is formed. Thus, the electronic component package 10 can be manufactured without increasing the size thereof more than necessary even if the internal volume of the first recess 32 is increased.

(10) According to the above embodiment, the plating layer 44 has a lower absorbance in the particular wavelength range than the flange 33. In the bonding step S107, the flange 33 is irradiated with laser light in the particular wavelength range. Therefore, the flange 33 melts easily, whereas the plating layer 44 does not melt easily. Thus, the plating layer 44 easily dissipates heat from the melted flange 33 while reducing laser absorption. This allows the plating layer 44 and the flange 33 to be bonded together by laser irradiation while preventing the seal ring 43, the brazing material layer 42, the metallized layer 41, and the base 20 from becoming hot and melting excessively.

(11) According to the above embodiment, the lid 30 has a relatively small flange thickness TF1 before the bonding step S107. Thus, the lid 30 can be sufficiently bonded even if the laser intensity for irradiation is reduced or the laser irradiation time is shortened.

OTHER EMBODIMENTS

The shapes of the particular surface 21 of the base 20, the members forming the bonding layer part 40, and the opening edge of the second recess 22 are not limited to a square frame shape. For example, these members may have a polygonal frame shape other than a square or may have a circular frame shape. That is, the above members may have any shape surrounding the first recess 32.

The electronic component 50 mounted in the electronic component package 10 is not limited to a component such as a quartz vibrator. For example, the electronic component 50 may be a component such as a microelectromechanical systems (MEMS) device or a battery.

The size and shape of the base 20 are not limited to the example in the present embodiment as long as the electronic component 50 can be mounted thereon. This also applies to the lid 30.

Figure 7:
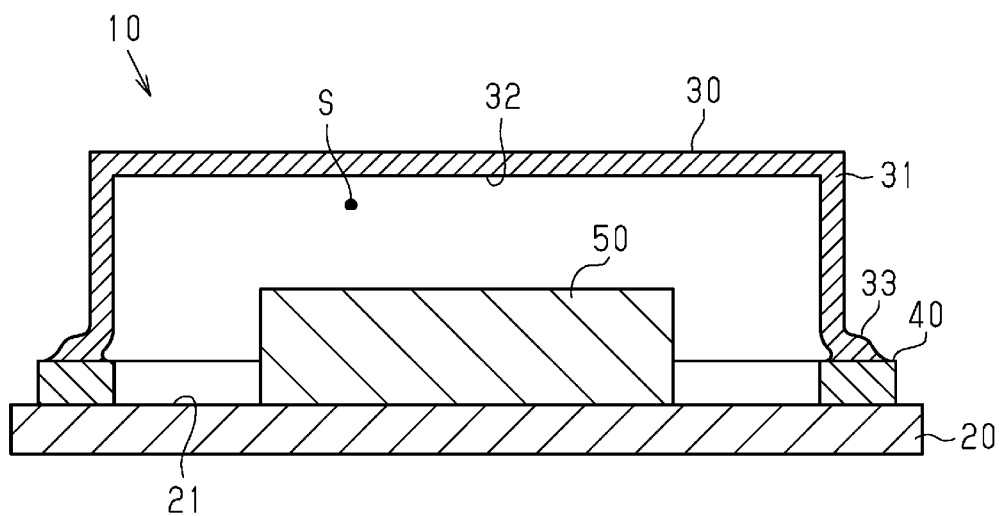
FIG. 7 is a sectional view of an electronic component package according to a modification.

As illustrated in FIG. 7, the base 20 need not have the second recess 22. That is, the base 20 may have a flat plate shape. In this example, the electronic component 50 is mounted on the particular surface 21. In addition, the position of the bonding layer part 40 relative to the particular surface 21 and the shape of the bonding layer part 40 are not limited.

The material for the base 20 is not limited to alumina ceramics. The material for the base 20 is preferably a nonmagnetic material that does not interfere with the operation of the electronic component 50 mounted in the space inside the electronic component package 10, for example, aluminum nitride.

It is sufficient that the bonding layer part 40 include at least the metallized layer 41 and the plating layer 44. That is, the bonding layer part 40 need not include one or both of the brazing material layer 42 and the seal ring 43 as long as the first recess 32 of the lid 30 can be sealed with the base 20. In addition, the bonding layer part 40 may include a layer or member other than the metallized layer 41, the brazing material layer 42, the seal ring 43, and the plating layer 44.

If the bonding layer part 40 does not include one or both of the brazing material layer 42 and the seal ring 43, it is desirable that the thickness of the bonding layer part 40 from the particular surface 21 to the surface 34 be ⅓ or more of the thickness of the lid 30. This allows the bonding layer part 40 to absorb heat, thereby reducing excessive heat transfer to the base 20.

The materials for the metallized layer 41, the brazing material layer 42, the seal ring 43, and the plating layer 44 are not limited to the examples mentioned in the present embodiment. In particular, the plating layer 44 need not contain one or more metals selected from gold, silver, and copper. In addition, the material for the seal ring 43 is preferably a metal having a linear expansion coefficient close to those of ceramics. This reduces the likelihood of defective bonding.

The metallized layer 41 need not contain glass.

The width WB of the brazing material layer 42, the width WM of the metallized layer 41, the seal ring width WS, and the width WP of the plating layer 44 may differ in dimension from each other.

The materials for the seal ring 43 and the flange 33 need not be identical.

The materials for the seal ring 43 and the lid 30 are not limited to Kovar. For example, an iron-nickel alloy may be used.

In the particular wavelength range, the absorbance of the plating layer 44 may be higher than or equal to the absorbance of the seal ring 43.

The width WM of the plating layer 44 may be larger in dimension than or equal to the width of the metallized layer 41. In addition, the plating layer 44 may cover a side surface of one or more selected from the seal ring 43, the brazing material layer 42, and the metallized layer 41.

The materials for the lid body 31 and the flange 33 are not limited to the example in the present embodiment. In addition, the materials for the lid body 31 and the flange 33 may differ from each other. That is, the flange 33 may be formed by bonding, to the opening edge of a lid body 31 having a box shape, a member formed of a different material from the lid body 31.

The flange width WF may be larger than or equal to the edge-to-edge width WE.

The flange width WF may be larger than or equal to the seal ring width WS.

The maximum dimension TF2 of the flange 33 may be larger than or equal to the maximum dimension TS2 of the seal ring 43 in a direction perpendicular to the particular surface 21.

The bonded portion 35 of the lid 30 need not have a fillet shape.

In the particular wavelength range, the absorbance of the plating layer 44 may be higher than or equal to the absorbance of the flange 33.

It is sufficient that the method for manufacturing the electronic component package 10 include at least the lid providing step S101, the metallizing step S102, the plating step S105, and the bonding step S107. That is, one or both of the brazing material applying step S103 and the seal ring bonding step S104 may be omitted. In addition, the method for manufacturing the electronic component package 10 may include a step not mentioned in the present embodiment. For example, the method for manufacturing the electronic component package 10 may include a step of bonding a layer or member other than the metallized layer 41, the brazing material layer 42, the seal ring 43, and the plating layer 44.

In the method for manufacturing the electronic component package 10, the lid providing step S101 may be performed at any time before the bonding step S107.

In the lid providing step S101, the method for forming the lid body 31 and the flange 33 is not limited to press forming.

In the lid providing step S101, the angle between the bottom surface of the first recess 32 and the side surfaces of the lid body 31 may be less than 45° or more than 90°. By increasing the angle between the bottom and side surfaces of the lid 30, the external size of the electronic component package 10 and the volume of the internal space S can be adjusted.

In the metallizing step S102, the material for the metallizing paste is not limited to the examples in the present embodiment as long as a metal film can be formed on the particular surface 21 of the base 20.

In the brazing material applying step S103, the material for the brazing material is not limited to the examples in the present embodiment as long as two layers can be brazed together.

In the plating step S105, the component of the plating solution is not limited to the examples in the present embodiment as long as the bonding layer part 40 excluding the plating layer 44 and the flange 33 can be bonded together.

In the bonding step S107, the wavelength range of the laser used may be outside the particular wavelength range as long as the flange 33 and the bonding layer part 40 can be bonded together. That is, the wavelength range of the laser may be less than 0.9 μm or more than 1.1 μm.

The flange thickness TF1 may be larger than the seal ring thickness TS1 before the bonding step.

Appendix

Technical ideas that can be derived from the above embodiment and modifications are described below.

(1) An electronic component package comprising a ceramic base; a metallized layer that is a metal film formed on a particular surface that is a particular flat outer surface of the base; a metal lid; a plating layer located between the metallized layer and the lid; and an electronic component mounted on the base. The lid includes a lid body having a recess and a flange having a frame shape extending along an opening edge of the recess. The flange extends outward of the recess in a direction parallel to the particular surface and is bonded to the metallized layer with the plating layer interposed therebetween. The metallized layer has a frame shape facing the flange, the base closes an opening of the recess, and the electronic component is located in a space defined by the base and the lid.

(2) The electronic component package according to (1), further comprising a brazing material layer located between the metallized layer and the plating layer; and a metal seal ring located between the brazing material layer and the plating layer. The plating layer has a lower absorbance in a wavelength range of from 0.9 μm to 1.1 μm than the seal ring.

(3) The electronic component package according to (2), wherein, as viewed in a cross-section perpendicular to the particular surface, a maximum dimension of the flange in a direction perpendicular to the particular surface is smaller than a maximum dimension of the seal ring in the direction perpendicular to the particular surface.

(4) The electronic component package according to (2) or (3), wherein, as viewed in a cross-section perpendicular to the particular surface, a dimension from the opening edge of the recess to a leading end of the flange in a direction along the particular surface is smaller than a dimension of the seal ring in the direction along the particular surface.

(5) The electronic component package according to any one of (1) to (4), wherein the plating layer contains one or more metals selected from gold, silver, and copper.

(6) The electronic component package according to any one of (1) to (5), wherein the plating layer has a lower absorbance in a wavelength range of from 0.9 μm to 1.1 μm than the flange.

(7) The electronic component package according to any one of (1) to (6), wherein the lid includes a bonded portion including a surface bonded to the plating layer, and as viewed in a cross-section perpendicular to the particular surface, a dimension of the bonded portion in a direction along the particular surface becomes larger toward the plating layer.

(8) The electronic component package according to any one of (1) to (7), wherein the recess is a first recess, the base has a second recess in the particular surface. Also, as viewed in a cross-section perpendicular to the particular surface, a dimension from the opening edge of the first recess to a leading end of the flange in a direction along the particular surface is smaller than a dimension from an opening edge of the second recess in the particular surface to an outer edge of the particular surface.

(9) A method for manufacturing an electronic component package, comprising a lid providing step of providing a lid including a lid body having a recess and a flange extending outward of the recess in a direction parallel to an imaginary plane surrounded by an opening edge of the recess; a metallizing step of forming a metallized layer having a frame shape corresponding to the flange on a particular surface that is a particular flat outer surface of a ceramic base on which an electronic component is mounted; a plating step of forming a plating layer on an opposite side from the base with respect to the metallized layer; and a bonding step of placing the flange on the plating layer such that the electronic component is located in the recess and irradiating the flange with laser light to bond the flange to the metallized layer with the plating layer interposed therebetween.

(10) The method for manufacturing an electronic component package according to (9), wherein the plating layer has a lower absorbance in a wavelength range of from 0.9 μm to 1.1 μm than the flange, and the bonding step includes irradiating the flange with laser light in a wavelength range of from 0.9 μm to 1.1 μm.

(11) The method for manufacturing an electronic component package according to (9) or (10), further comprising a seal ring bonding step of bonding a metal seal ring between the metallized layer and the plating layer. A thickness of the seal ring is a dimension of the seal ring in a direction perpendicular to the particular surface as viewed in a cross-section perpendicular to the particular surface. A thickness of the flange is a dimension of the flange in a direction perpendicular to the imaginary plane as viewed in a cross-section perpendicular to the imaginary plane, and the thickness of the flange is smaller than or equal to the thickness of the seal ring before the bonding step.

What is claimed is:

1. An electronic component package comprising:
   a ceramic base;
   a metallized layer that is a metal film on a particular surface that is a particular flat outer surface of the base;
   a metal lid;
   a plating layer between the metallized layer and the lid;
   an electronic component mounted on the base;
   a brazing material layer between the metallized layer and the plating layer; and
   a metal seal ring between the brazing material layer and the plating layer,
   wherein the plating layer has a lower absorbance in a wavelength range of from 0.9 μm to 1.1 μm than the seal ring,
   the lid includes a lid body having a recess and a flange having a frame shape extending along an opening edge of the recess,
   the flange extends outward of the recess in a direction parallel to the particular surface and is bonded to the metallized layer with the plating layer interposed therebetween,
   the metallized layer has a frame shape facing the flange,
   the base closes an opening of the recess, and
   the electronic component is in a space defined by the base and the lid.

2. The electronic component package according to claim 1, wherein
   as viewed in a cross-section perpendicular to the particular surface, a maximum dimension of the flange in a direction perpendicular to the particular surface is smaller than a maximum dimension of the seal ring in the direction perpendicular to the particular surface.

3. The electronic component package according to claim 1, wherein
   as viewed in a cross-section perpendicular to the particular surface, a dimension from the opening edge of the recess to a leading end of the flange in a direction along the particular surface is smaller than a dimension of the seal ring in the direction along the particular surface.

4. The electronic component package according to claim 1, wherein
   the plating layer includes one or more metals selected from gold, silver, and copper.

5. The electronic component package according to claim 1, wherein
   the lid includes a bonded portion including a surface bonded to the plating layer, and
   as viewed in a cross-section perpendicular to the particular surface, a dimension of the bonded portion in a direction along the particular surface becomes larger toward the plating layer.

6. The electronic component package according to claim 1, wherein
   the recess is a first recess,
   the base has a second recess in the particular surface, and
   as viewed in a cross-section perpendicular to the particular surface, a dimension from the opening edge of the first recess to a leading end of the flange in a direction along the particular surface is smaller than a dimension from an opening edge of the second recess in the particular surface to an outer edge of the particular surface.

7. An electronic component package comprising:
   a ceramic base;
   a metallized layer that is a metal film on a particular surface that is a particular flat outer surface of the base;
   a metal lid;
   a plating layer between the metallized layer and the lid; and
   an electronic component mounted on the base,
   wherein the lid includes a lid body having a recess and a flange having a frame shape extending along an opening edge of the recess, the flange extends outward of the recess in a direction parallel to the particular surface and is bonded to the metallized layer with the plating layer interposed therebetween, the metallized layer has a frame shape facing the flange, the base closes an opening of the recess, the electronic component is in a space defined by the base and the lid, and the plating layer has a lower absorbance in a wavelength range of from 0.9 µm to 1.1 µm than the flange.

8. A method for manufacturing an electronic component package, comprising:

providing a metal lid including a lid body having a recess and a flange extending outward of the recess in a direction parallel to an imaginary plane surrounded by an opening edge of the recess;

forming a metallized layer having a frame shape corresponding to the flange on a particular surface that is a particular flat outer surface of a ceramic base on which an electronic component is mounted;

forming a plating layer on an opposite side from the base with respect to the metallized layer;

forming a brazing material layer between the metallized layer and the plating layer;

bonding a metal seal ring between the brazing material layer and the plating layer, wherein the plating layer has a lower absorbance in a wavelength range of from 0.9 µm to 1.1 µm than the seal ring; and placing the flange on the plating layer such that the electronic component is in the recess and irradiating the flange with laser light to bond the flange to the metallized layer with the plating layer interposed therebetween.

9. The method for manufacturing an electronic component package according to claim 8, wherein the irradiating includes irradiating the flange with laser light in a wavelength range of from 0.9 µm to 1.1 µm.

10. The method for manufacturing an electronic component package according to claim 8, wherein a thickness of the seal ring is a dimension of the seal ring in a direction perpendicular to the particular surface as viewed in a cross-section perpendicular to the particular surface, a thickness of the flange is a dimension of the flange in a direction perpendicular to the imaginary plane as viewed in a cross-section perpendicular to the imaginary plane, and the thickness of the flange is smaller than or equal to the thickness of the seal ring before the bonding.

11. The method for manufacturing an electronic component package according to claim 9, wherein a thickness of the seal ring is a dimension of the seal ring in a direction perpendicular to the particular surface as viewed in a cross-section perpendicular to the particular surface, a thickness of the flange is a dimension of the flange in a direction perpendicular to the imaginary plane as viewed in a cross-section perpendicular to the imaginary plane, and the thickness of the flange is smaller than or equal to the thickness of the seal ring before the bonding.

* * * * *